(12) United States Patent
Mou et al.

(10) Patent No.: US 11,286,922 B2
(45) Date of Patent: Mar. 29, 2022

(54) MINIATURE PIEZOELECTRIC PUMP MODULE

(71) Applicant: Microjet Technology Co., Ltd., Hsinchu (TW)

(72) Inventors: Hao-Jan Mou, Hsinchu (TW); Shen-Wen Chen, Hsinchu (TW); Shih-Chang Chen, Hsinchu (TW); Chun-Hung Liao, Hsinchu (TW); Chi-Feng Huang, Hsinchu (TW); Yung-Lung Han, Hsinchu (TW); Chun-Yi Kuo, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 151 days.

(21) Appl. No.: 16/677,942

(22) Filed: Nov. 8, 2019

(65) Prior Publication Data

US 2020/0149524 A1    May 14, 2020

(30) Foreign Application Priority Data

Nov. 13, 2018   (TW) .................................. 107140142

(51) Int. Cl.
*F04B 43/04* (2006.01)
*H01L 41/04* (2006.01)
*F04B 17/00* (2006.01)

(52) U.S. Cl.
CPC .......... *F04B 43/046* (2013.01); *H01L 41/042* (2013.01); *F04B 17/003* (2013.01); *F04B 43/043* (2013.01)

(58) Field of Classification Search
CPC .... F04B 17/003; F04B 43/043; F04B 43/046; H01L 41/042

(Continued)

(56) References Cited

U.S. PATENT DOCUMENTS

2005/0225202 A1* 10/2005 Vogeley ................ H01L 41/042
                                                310/317
2007/0242427 A1* 10/2007 Yamamoto ............. G06F 1/206
                                                361/689
2014/0070665 A1    3/2014 Muggler et al.

FOREIGN PATENT DOCUMENTS

CN          1175554 C       11/2004
CN          1922401 A        2/2007
                    (Continued)

*Primary Examiner* — Connor J Tremarche
(74) *Attorney, Agent, or Firm* — Birch, Stewart, Kolasch & Birch, LLP

(57) ABSTRACT

A miniature piezoelectric pump module is provided and includes a piezoelectric pump, a microprocessor, a driving component and a feedback circuit. The piezoelectric pump includes two electrodes and a piezoelectric element and has the best efficiency while operating under an ideal operating voltage. The driving component is electrically connected to the microprocessor and the piezoelectric pump and includes a transform element and an inverting element. The transform element outputs an effective operating voltage to the piezoelectric pump. The inverting element controls the two electrodes to receive the effective operating voltage or to be grounded. The piezoelectric element is subjected to deformation for transporting fluid due to piezoelectric effect. The feedback circuit generates a feedback voltage according to the effective operating voltage. The microprocessor adjusts the modulation signal according to the feedback voltage for adjusting the effective operating voltage outputted by the transform element to approach the ideal operating voltage.

10 Claims, 3 Drawing Sheets

(58) Field of Classification Search
USPC .................................................... 417/413.2
See application file for complete search history.

(56) References Cited

FOREIGN PATENT DOCUMENTS

| | | |
|---|---|---|
| CN | 101546966 A | 9/2009 |
| CN | 111140482 A | 5/2020 |
| JP | 2005-315225 A | 11/2005 |
| TW | 200903975 A | 1/2009 |
| TW | 201311462 A1 | 3/2013 |
| TW | M545188 U | 7/2017 |
| TW | M545189 U | 7/2017 |

\* cited by examiner

MINIATURE PIEZOELECTRIC PUMP MODULE

FIELD OF THE INVENTION

The present disclosure relates to a miniature piezoelectric pump module, and more particularly to a miniature piezoelectric pump module capable of accurately controlling an operating voltage of a piezoelectric pump by a microprocessor with feedback circuit.

BACKGROUND OF THE INVENTION

With the rapid development of technology, the applications of fluid transportation devices are becoming more and more diversified. For example, fluid transportation devices are gradually popular in industrial applications, biomedical applications, medical care applications, heat dissipation applications, or even the wearable devices. It is obvious that the trends of designing fluid transportation devices are toward the miniature structure. Since it is hard to miniaturize pumps to a millimeter-sized volume, fluid transportation devices can only utilize the piezoelectric pump structure as miniature fluid transportation device.

In response to an applied voltage, a piezoelectric element is subjected to deformation due to piezoelectric effect, and the variation of the pressure inside the piezoelectric element drives the piezoelectric pump to transport fluid. Therefore, the operating voltage on the piezoelectric element affects the performance of the piezoelectric pump a lot. However, affected by loss or heat source, the operating voltage applied on the piezoelectric element may be fluctuated or insufficient. Accordingly, the efficiency of piezoelectric pump may be fluctuated or decreased.

SUMMARY OF THE INVENTION

An object of the present disclosure provides a miniature piezoelectric pump structure. A feedback circuit acquires and transmits the operating voltage of the piezoelectric element back to the microprocessor. Accordingly, the microprocessor is able to control the operating voltage applied on the piezoelectric element.

In accordance with an aspect of the present disclosure, a miniature piezoelectric pump module is provided. The miniature piezoelectric pump module includes a piezoelectric pump, a microprocessor, a driving component and a feedback circuit. The piezoelectric pump includes a first electrode, a second electrode and a piezoelectric element. The piezoelectric pump has the best efficiency while operating under an ideal operating voltage. The microprocessor outputs a control signal and a modulation signal. The driving component is electrically connected to the microprocessor and the piezoelectric pump and includes a transform element and an inverting element. The transform element receives the modulation signal and outputs an effective operating voltage to the piezoelectric pump. The inverting element receives the modulation signal. According to the modulation signal, the inverting element controls the first electrode and the second electrode of the piezoelectric pump to receive the effective operating voltage or to be grounded. The second electrode is grounded when the first electrode receives the effective operating voltage. The second electrode receives the effective operating voltage when the first electrode is grounded. The piezoelectric element is subjected to deformation due to piezoelectric effect caused by a voltage difference between the first electrode and the second electrode. The deformation of the piezoelectric element is configured to transport fluid. The feedback circuit is electrically connected between the piezoelectric pump and the microprocessor. The feedback circuit generates a feedback voltage according to the effective operating voltage of the piezoelectric pump. The microprocessor receives the feedback voltage transmitted from the feedback circuit and adjusts the modulation signal according to the feedback voltage, so as to adjust the effective operating voltage outputted by the transform element to approach the ideal operating voltage.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
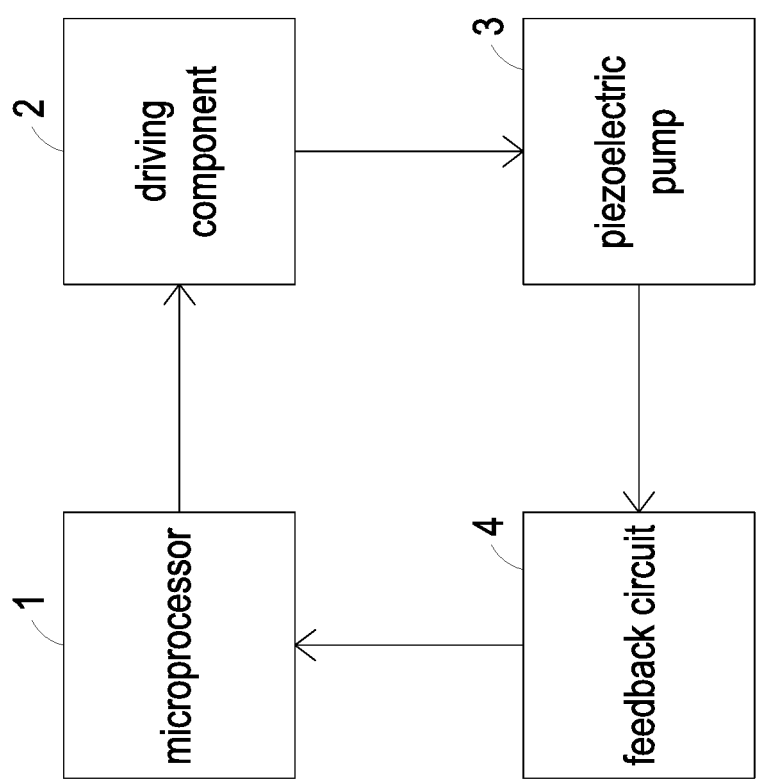
FIG. 1 is a schematic block diagram illustrating a miniature piezoelectric pump module according to an embodiment of the present disclosure.

Please refer to FIG. 1. The miniature piezoelectric pump module 100 includes a microprocessor 1, a driving component 2, a piezoelectric pump 3 and a feedback circuit 4. The piezoelectric pump 3 has the best efficiency while operating under an ideal operating voltage. The microprocessor 1 outputs a control signal and a modulation signal to the driving component 2. The driving component 2 is electrically connected to the piezoelectric pump 3. The driving component 2 provides an effective operating voltage to the piezoelectric pump 3 according to the control signal and the modulation signal. The feedback circuit 4 feeds the effective operating voltage of the piezoelectric pump 3 back to the microprocessor 1. Accordingly, through the modulation signal, the microprocessor 1 adjusts the effective operating voltage outputted by the driving component 2 to approach the ideal operating voltage of the piezoelectric pump 3.

Figure 2:
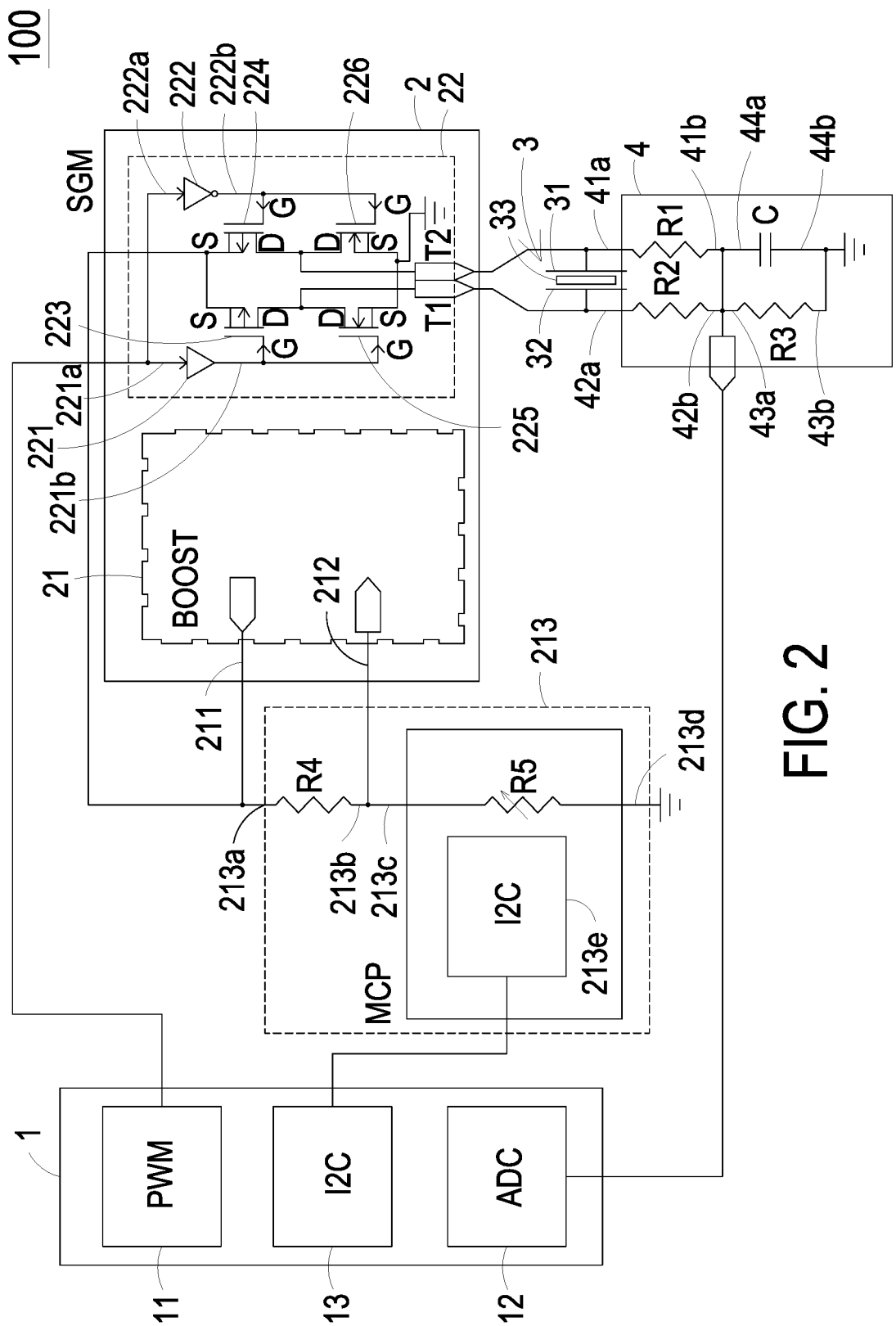
FIG. 2 is a schematic circuit diagram illustrating the miniature piezoelectric pump module according to the embodiment of the present disclosure.

Please refer to FIG. 2. The microprocessor 1 includes a control unit 11, a converting unit 12 and a communication unit 13. The driving component 2 includes a transform element 21 and an inverting element 22. The piezoelectric pump 3 includes a first electrode 31, a second electrode 32 and a piezoelectric element 33. The communication unit 13 is electrically connected to the transform element 21 for outputting the modulation signal to the transform element 21. The transform element 21 regulates the voltage to the effective operating voltage according to the modulation signal, and transmits the effective operating voltage to the inverting element 22. The control unit 11 is electrically connected to the inverting element 22. The inverting element 22 controls the first electrode 31 and the second electrode 32 of the piezoelectric pump 3 to receive the effective operating voltage or to be grounded. In this embodiment, the constant voltage and the ideal operating voltage are 5V and 15V respectively, but not limited thereto.

Please continue referring to FIG. 2. The feedback circuit 4 is electrically connected between the piezoelectric pump 3 and the microprocessor 1. The feedback circuit 4 includes a first resistor R1, a second resistor R2, a third resistor R3 and a capacitor C. The first resistor R1 has a first contact 41a and a second contact 41b. The second resistor R2 has a third contact 42a and a fourth contact 42b. The third resistor R3 has a fifth contact 43a and a sixth contact 43b. The capacitor C has a seventh contact 44a and an eighth contact 44b. The first contact 41a of the first resistor R1 is electrically connected to the first electrode 31 of the piezoelectric pump 3. The third contact 42a of the second resistor R2 is electrically connected to the second electrode 32 of the piezoelectric pump 3. The sixth contact 43b of the third resistor R3 is electrically connected to the eighth contact 44b of the capacitor C and is grounded. The fifth contact 43a of the third resistor R3 is electrically connected to the seventh contact 44a of the capacitor C. The third resistor R3 is connected to the capacitor C in parallel. Further, the third resistor R3 is electrically connected to the second contact 41b of the first resistor R1, the fourth contact 42b of the second resistor R2 and the microprocessor 1. Therefore, the effective operating voltage between the first electrode 31 and the second electrode 32 of the piezoelectric pump 3 is divided. The feedback voltage is generated according to the divided effective operating voltage, and the feedback voltage is fed back to the converting unit 12 of the microprocessor 1. The first resistor R1 and the second resistor R2 have the same resistance, but no limited thereto. In addition, the capacitor C is configured for filtering, so as to prevent the feedback voltage from being interfered by noise.

The transform element 21 further includes a voltage output terminal 211, a transform feedback terminal 212 and a transform feedback circuit 213. The voltage output terminal 211 is electrically connected to the inverting element 22. The transform feedback circuit 213 is electrically connected between the microprocessor 1 and the transform feedback terminal 212. The transform feedback circuit 213 includes a fourth resistor R4 and a fifth resistor R5. The fourth resistor R4 has a first node 213a and a second node 213b. The fifth resistor R5 has a third node 213c and a fourth node 213d. The first node 213a of the fourth resistor R4 is electrically connected to the voltage output terminal 211. The third node 213c of the fifth resistor R5 is electrically connected to the second node 213b of the fourth resistor R4 and the transform feedback terminal 212. The fourth node 213d of the fifth resistor R5 is grounded. The fifth resistor R5 is a variable resistor. In this embodiment, the fifth resistor R5 is a digital variable resistor having a communication interface 213e. The communication interface 213e is electrically connected to the communication unit 13 of the microprocessor 1. Therefore, the communication unit 13 can transmit the modulation signal to the digital variable resistor (i.e., the fifth resistor R5) for adjusting the resistance thereof. The effective operating voltage, outputted by the voltage output terminal 211 of the transform element 21, is divided by the fourth resistor R4 and the fifth resistor R5 of the transform feedback circuit 213. Afterwards, the divided effective operating voltage is transmitted back to the transform element 21 through the transform feedback terminal 212. Accordingly, the transform element 21 examines if the effective operating voltage outputted by the transform element 21 is consistent with the ideal operating voltage. If the effective operating voltage is different from the ideal operating voltage, the effective operating voltage outputted by the transform element 21 is continuously adjusted to approach the ideal operating voltage. The effective operating voltage is adjusted to equal the ideal operating voltage lastly.

Please continue referring to FIG. 2. The inverting element 22 includes a buffer gate 221, an inverter 222, a first P-type MOSFET (metal-oxide-semiconductor field-effect transistor) 223, a second P-type MOSFET 224, a first N-type MOSFET 225 and a second N-type MOSFET 226. The buffer gate 221 has a buffer input terminal 221a and a buffer output terminal 221b. The inverter 222 has an inverter input terminal 222a and an inverter output terminal 222b. Each of the first P-type MOSFET 223, the second P-type MOSFET 224, the first N-type MOSFET 225 and the second N-type MOSFET 226 has a gate G, a drain D and a source S. The buffer input terminal 221a of the buffer gate 221 and the inverter input terminal 222a of the inverter 222 are electrically connected to the control unit 11 of the microprocessor 1 for receiving the control signal. The control signal is for example but not limited to a pulse width modulation signal. The buffer output terminal 221b of the buffer gate 221 is electrically connected to the gate G of the first P-type MOSFET 223 and the gate G of the first N-type MOSFET 225. The inverter output terminal 222b of the inverter 222 is electrically connected to the gate G of the second P-type MOSFET 224 and the gate G of the second N-type MOSFET 226. The source S of the first P-type MOSFET 223 and the source S of the second P-type MOSFET 224 are electrically connected to the voltage output terminal 211 of the transform element 21 for receiving the effective operating voltage outputted by the transform element 21. The drain D of the first P-type MOSFET 223 is electrically connected to the drain D of the first N-type MOSFET 225 and the second electrode 32 of the piezoelectric pump 3. The drain D of the second P-type MOSFET 224 is electrically connected to the drain D of the second N-type MOSFET 226 and the first electrode 31 of the piezoelectric pump 3. The source S of the first N-type MOSFET 225 is electrically connected to the source S of the second N-type MOSFET 226 and is grounded.

The first P-type MOSFET 223, the second P-type MOSFET 224, the first N-type MOSFET 225 and the second N-type MOSFET 226 form an H-bridge. The H-bridge converts the effective operating voltage from DC to AC and supplies to the piezoelectric pump 3. Therefore, the first P-type MOSFET 223 and the second P-type MOSFET 224 have to receive opposite signals, and the first N-type MOSFET 225 and the second N-type MOSFET 226 have to receive opposite signals. Before transmitting the control signal from the microprocessor 1 to the second P-type MOSFET 224, the control signal passes through the inverter 222. Accordingly, the control signal received by the second P-type MOSFET 224 is in opposite phase to the control signal received by the first P-type MOSFET 223. Moreover, the first P-type MOSFET 223 and the second P-type MOSFET 224 have to receive the control signals simultaneously. Therefore, the buffer gate 221 is disposed before the first P-type MOSFET 223 so that the first P-type MOSFET 223 and the second P-type MOSFET 224 can receive the opposite signals simultaneously. For the same reason, the first N-type MOSFET 225 and the second N-type MOSFET 226 can receive the opposite signals simultaneously.

In the first control step, the first P-type MOSFET 223 and the second N-type MOSFET 226 are turned on, and the second P-type MOSFET 224 and the first N-type MOSFET 225 are turned off. Under this circumstance, the effective operating voltage is transmitted to the second electrode 32 of the piezoelectric pump 3 through the first P-type MOSFET 223. Since the second N-type MOSFET 226 is turned on, the first electrode 31 of the piezoelectric pump 3 is grounded. In the second control step, the first P-type MOSFET 223 and the second N-type MOSFET 226 are turned off, and the second P-type MOSFET 224 and the first N-type MOSFET 225 are turned on. Under this circumstance, the effective operating voltage is transmitted to the first electrode 31 of the piezoelectric pump 3 through the second P-type MOSFET 224. Since the first N-type MOSFET 225 is turned on, the second electrode 32 of the piezoelectric pump 3 is grounded. By repeating the first and second control steps, the first electrode 31 and the second electrode 32 are controlled to receive the effective operating voltage or to be grounded. Correspondingly, the piezoelectric element 33 of the piezoelectric pump 3 is subjected to deformation due to piezoelectric effect, which causes the variation of the pressure of the chamber (not shown) inside the piezoelectric pump 3. Consequently, the fluid can be transported continuously.

Figure 3A:
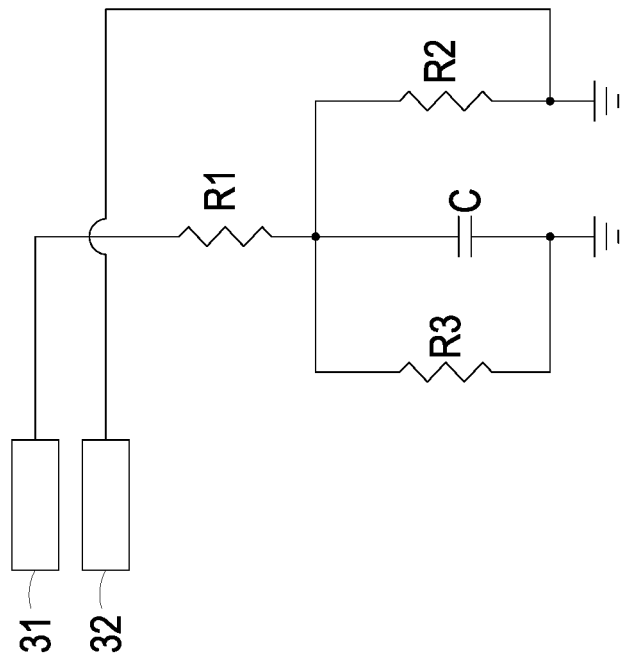
FIG. 3A is an equivalent circuit diagram illustrating a feedback circuit under the first control step.
Figure 3B:
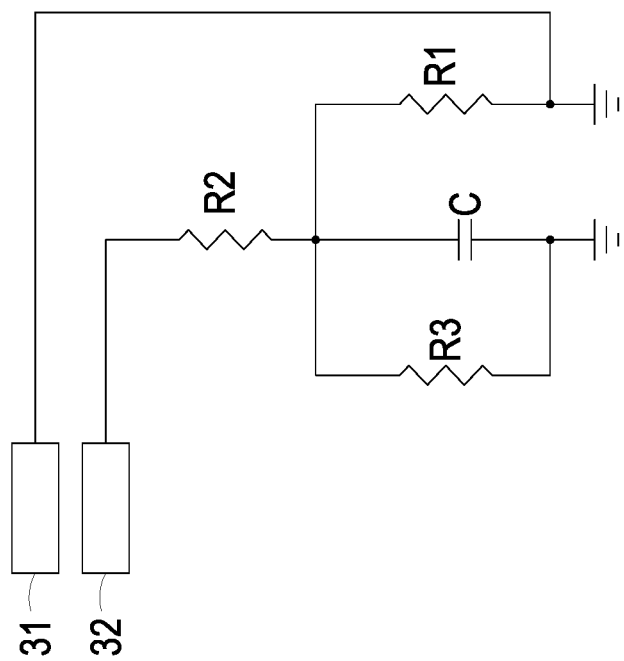
FIG. 3B is an equivalent circuit diagram illustrating the feedback circuit under the second control step.

The feedback circuit 4 continuously receives the effective operating voltage or the ground potential from the first electrode 31 and the second electrode 32 of the piezoelectric pump 3. In the first control step, the second electrode 32 has the effective operating voltage, and the first electrode 31 is grounded. Under this circumstance, the equivalent circuit of the feedback circuit 4 is shown in FIG. 3A. The first resistor R1 is connected to the third resistor R3 in parallel. The feedback voltage equals (R1//R3)÷[(R1//R3)+R2] multiplied by the effective operating voltage. In addition, in the second control step, the first electrode 31 has the effective operating voltage, and the second electrode 32 is grounded. Under this circumstance, the equivalent circuit of the feedback circuit 4 is shown in FIG. 3B. The second resistor R2 is connected to the third resistor R3 in parallel. The feedback voltage equals (R2//R3)÷[(R2//R3)+R1] multiplied by the effective operating voltage. The feedback circuit 4 transmits the feedback voltage to the microprocessor 1. According to the received feedback voltage, the microprocessor 1 determines and compares the current effective operating voltage of the piezoelectric pump 3 with the ideal operating voltage. If the effective operating voltage is different from the ideal operating voltage, the feedback voltage is converted into the modulation signal as a digital signal by the converting unit 12. The digital modulation signal is transmitted to the communication interface 213e by the communication unit 13 for adjusting the fifth resistor R5 (i.e., digital variable resistor). The effective operating voltage, which is outputted by the voltage output terminal 211 of the transform element 21, is divided by the fourth resistor R4 and the fifth resistor R5 of the transform feedback circuit 213. Then, the divided effective operating voltage is transmitted from the transform feedback terminal 212 to the transform element 21. Accordingly, the transform element 21 examines if the effective operating voltage outputted by the transform element 21 is consistent with the ideal operating voltage. If the effective operating voltage is different from the ideal operating voltage, the effective operating voltage outputted by the transform element 21 is continuously adjusted to approach the ideal operating voltage. The effective operating voltage is adjusted to equal the ideal operating voltage lastly. Through the above steps, the effective operating voltage received by the piezoelectric pump 3 can be kept at the ideal operating voltage, so that the piezoelectric pump 3 can operate with the best efficiency continuously.

From the above descriptions, the present disclosure provides a miniature piezoelectric pump module. The feedback circuit transmits the effective operating voltage of the piezoelectric pump back to the microprocessor. According to the feedback voltage, the microprocessor can adjust the effective operating voltage outputted by the transform element. The effective operating voltage is adjusted to approach the ideal operating voltage and is lastly consistent with the ideal operating voltage. Therefore, the piezoelectric pump continuously can operate under the ideal operating voltage with the best transportation efficiency. Moreover, the present invention overcomes the drawbacks of the insufficient or inconsistent efficiency caused by the fluctuated or insufficient effective operating voltage of the piezoelectric pump in prior arts. The present invention is industrially valuable.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A miniature piezoelectric pump module, comprising:
a piezoelectric pump comprising a first electrode, a second electrode and a piezoelectric element;
a microprocessor outputting a control signal and a modulation signal;
a driving component electrically connected to the microprocessor and the piezoelectric pump, comprising:
a transform element receiving the modulation signal and outputting an effective operating voltage to the piezoelectric pump; and
an inverting element receiving the modulation signal and comprising a buffer gate, an inverter, a first P-type MOSFET, a second P-type MOSFET, a first N-type MOSFET and a second N-type MOSFET, wherein according to the modulation signal, the inverting element controls the first electrode and the second electrode of the piezoelectric pump to receive the effective operating voltage or to be grounded, wherein the second electrode is grounded when the first electrode receives the effective operating voltage, and the second electrode receives the effective operating voltage when the first electrode is grounded, whereby the piezoelectric element is subjected to deformation due to piezoelectric effect caused by a voltage difference between the first electrode and the second electrode, and the deformation of the piezoelectric element is configured to transport fluid; and
a feedback circuit electrically connected between the piezoelectric pump and the microprocessor, wherein the feedback circuit generates a feedback voltage according to the effective operating voltage of the piezoelectric pump,
wherein the microprocessor receives the feedback voltage transmitted from the feedback circuit and adjusts the modulation signal according to the feedback voltage, so as to adjust the effective operating voltage outputted by the transform element to approach a specific operating voltage.

2. The miniature piezoelectric pump module according to claim 1, wherein the feedback circuit comprises a first resistor, a second resistor, a third resistor and a capacitor, wherein the first resistor has a first contact and a second contact, the second resistor has a third contact and a fourth contact, the third resistor has a fifth contact and a sixth contact, and the capacitor has a seventh contact and an eighth contact, wherein the first contact of the first resistor is electrically connected to the first electrode of the piezoelectric pump, the third contact of the second resistor is electrically connected to the second electrode of the piezoelectric pump, the sixth contact of the third resistor is electrically connected to the eighth contact of the capacitor and is grounded, the fifth contact of the third resistor is electrically connected to the seventh contact of the capacitor, the third resistor is connected to the capacitor in parallel, and the third resistor is electrically connected to the second contact of the first resistor, the fourth contact of the second resistor and the microprocessor, whereby the effective operating voltage between the first electrode and the second electrode of the piezoelectric pump is divided and the feedback voltage is generated therefrom, and the feedback voltage is fed back to the microprocessor.

3. The miniature piezoelectric pump module according to claim 2, wherein the first resistor and the second resistor have the same resistance.

4. The miniature piezoelectric pump module according to claim 3, wherein the transform element further comprises a voltage output terminal, a transform feedback terminal and a transform feedback circuit, the voltage output terminal is electrically connected to the inverting element, and the transform feedback circuit is electrically connected between the microprocessor and the transform feedback terminal.

5. The miniature piezoelectric pump module according to claim 4, wherein the transform feedback circuit comprises a fourth resistor and a fifth resistor, the fourth resistor has a first node and a second node, the fifth resistor has a third node and a fourth node, the first node of the fourth resistor is electrically connected to the voltage output terminal, the third node of the fifth resistor is electrically connected to the second node of the fourth resistor and the transform feedback terminal, and the fourth node is grounded.

6. The miniature piezoelectric pump module according to claim 5, wherein the fifth resistor is a variable resistor.

7. The miniature piezoelectric pump module according to claim 5, wherein the fifth resistor is a digital variable resistor.

8. The miniature piezoelectric pump module according to claim 7, wherein the microprocessor comprises a converting unit and a communication unit, the communication unit is connected to the digital variable resistor, the converting unit receives and converts the feedback voltage into the modulation signal as a digital signal, the modulation signal is transmitted to the digital variable resistor by the communication unit for adjusting the digital variable resistor, and the effective operating voltage outputted by the transform element is adjusted accordingly to approach the ideal operating voltage.

9. The miniature piezoelectric pump module according to claim 1, wherein the buffer gate has a buffer input terminal and a buffer output terminal, wherein the inverter has an inverter input terminal and an inverter output terminal, wherein each of the first P-type MOSFET, the second P-type MOSFET, the first N-type MOSFET and the second N-type MOSFET has a gate, a drain and a source, wherein the buffer input terminal of the buffer gate and the inverter input terminal of the inverter are electrically connected to the microprocessor for receiving the control signal, the buffer output terminal of the buffer gate is electrically connected to the gate of the first P-type MOSFET and the gate of the first N-type MOSFET, the inverter output terminal of the inverter is electrically connected to the gate of the second P-type MOSFET and the gate of the second N-type MOSFET, the source of the first P-type MOSFET and the source of the second P-type MOSFET are electrically connected to the voltage output terminal of the transform element for receiving the effective operating voltage, the drain of the first P-type MOSFET is electrically connected to the drain of the first N-type MOSFET and the second electrode of the piezoelectric pump, the drain of the second P-type MOSFET is electrically connected to the drain of the second N-type MOSFET and the first electrode of the piezoelectric pump, and the source of the first N-type MOSFET is electrically connected to the source of the second N-type MOSFET and is grounded.

10. The miniature piezoelectric pump module according to claim 9, wherein the control signal is a pulse width modulation signal.

* * * * *